(12) United States Patent
Govindasamy et al.

(10) Patent No.: US 12,417,903 B2
(45) Date of Patent: Sep. 16, 2025

(54) PHYSICAL VAPOR DEPOSITION SOURCE AND CHAMBER ASSEMBLY

(71) Applicant: Applied Materials, Inc., Santa Clara, CA (US)

(72) Inventors: Sathiyamurthi Govindasamy, Coimbatore (IN); Harish V. Penmethsa, Dublin, CA (US); Suresh Palanisamy, Coimbatore (IN); Naresh Kumar Asokan, Coimbatore (IN); Karunakaran Nataraj, Coimbatore (IN)

(73) Assignee: Applied Materials, Inc., Santa Clara, CA (US)

( * ) Notice: Subject to any disclaimer, the term of this patent is extended or adjusted under 35 U.S.C. 154(b) by 204 days.

(21) Appl. No.: 18/110,668

(22) Filed: Feb. 16, 2023

(65) Prior Publication Data
US 2024/0282558 A1 Aug. 22, 2024

(51) Int. Cl.
*H01J 37/34* (2006.01)

(52) U.S. Cl.
CPC ...... *H01J 37/3408* (2013.01); *H01J 37/3452* (2013.01); *H01J 37/3455* (2013.01); *H01J 2237/002* (2013.01)

(58) Field of Classification Search
CPC .................................. H01J 37/3408
See application file for complete search history.

(56) References Cited

U.S. PATENT DOCUMENTS

| 6,679,981 | B1 | 1/2004 | Pan et al. |
| 6,790,323 | B2 | 9/2004 | Fu et al. |
| 7,618,521 | B2 | 11/2009 | Fu |
| 7,682,495 | B2 * | 3/2010 | Mullapudi .......... H01J 37/3408 204/298.16 |
| 7,846,310 | B2 | 12/2010 | Gillard et al. |
| 8,460,519 | B2 | 6/2013 | Ye et al. |
| 9,096,927 | B2 | 8/2015 | West et al. |
| 2002/0046945 | A1 | 4/2002 | Hosokawa et al. |
| 2006/0011470 | A1 * | 1/2006 | Hatch ................. H01J 37/3455 204/192.12 |

(Continued)

FOREIGN PATENT DOCUMENTS

| CN | 103088306 A | 5/2013 |
| KR | 1020130143445 A | 12/2013 |

OTHER PUBLICATIONS

PCT International Search Report and Written Opinion dated May 23, 2024, for International Application No. PCT/US2024/012484.

*Primary Examiner* — John J Brayton
(74) *Attorney, Agent, or Firm* — Patterson + Sheridan, LLP

(57) ABSTRACT

Apparatus and methods for improving film uniformity in a physical vapor deposition (PVD) process are provided herein. In some embodiments, a magnetron translation assembly comprises a first linear actuator assembly with a first rail which is aligned in a first direction and a first actuator that is configured to position a first mount along the first rail; a magnet assembly is mounted on the first mount, the magnet assembly constructed and arranged to be rotated about an axis perpendicular to the first rail; and a second linear actuator assembly comprising a second mount that is configured to be positioned along a second rail, which is aligned in a second direction and the first linear actuator assembly is coupled to a mounting surface of the second mount.

20 Claims, 15 Drawing Sheets

(56) References Cited

U.S. PATENT DOCUMENTS

| | | |
|---|---|---|
| 2012/0027954 A1 | 2/2012 | Liu et al. |
| 2013/0213797 A1 | 8/2013 | Lin et al. |
| 2016/0035547 A1 | 2/2016 | Johanson et al. |
| 2021/0351024 A1 | 11/2021 | Sun et al. |
| 2022/0037136 A1 | 2/2022 | Subramani et al. |
| 2022/0178014 A1* | 6/2022 | Maeda ................ H01J 37/3423 |

* cited by examiner

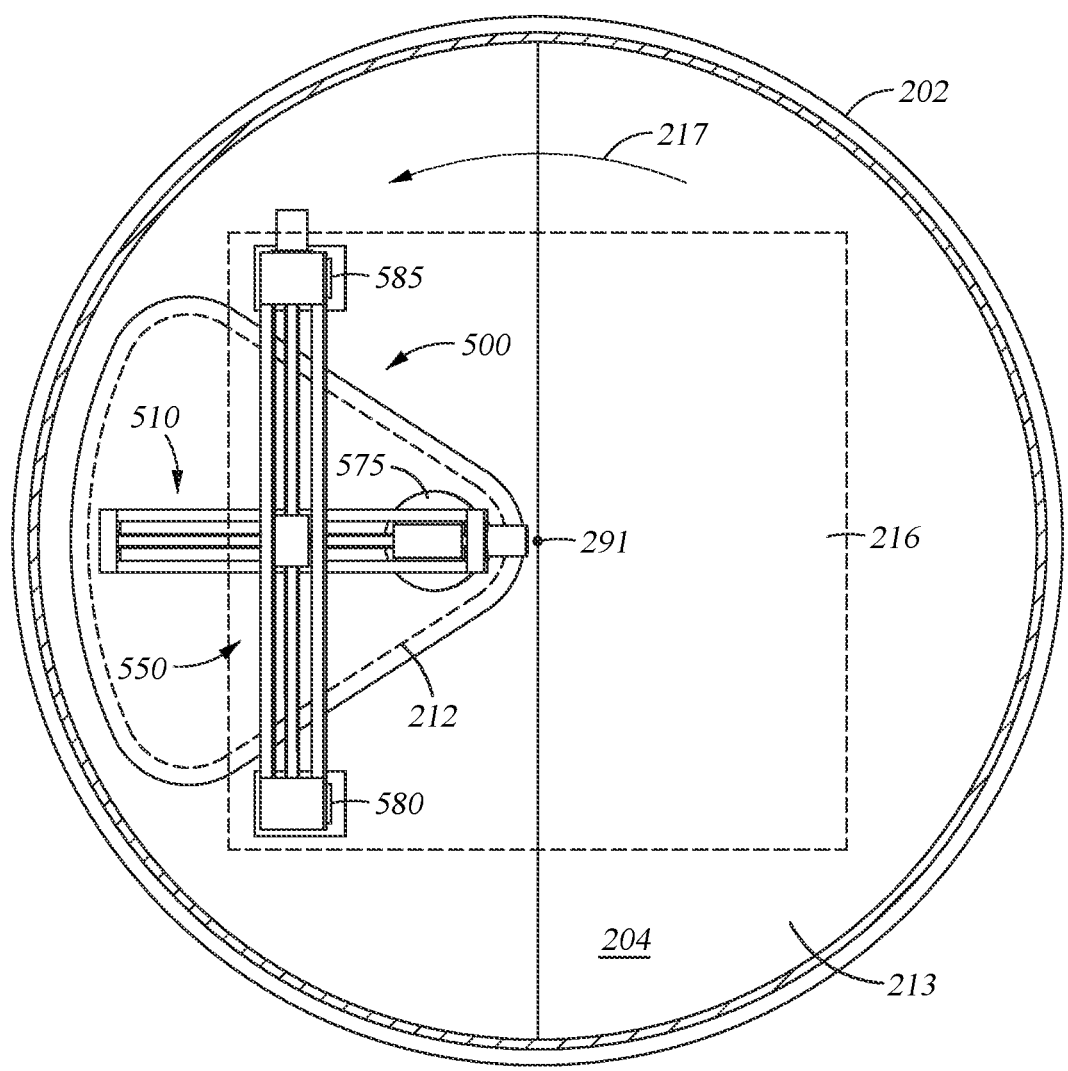
Fig. 5A
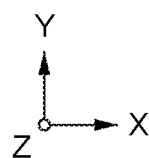

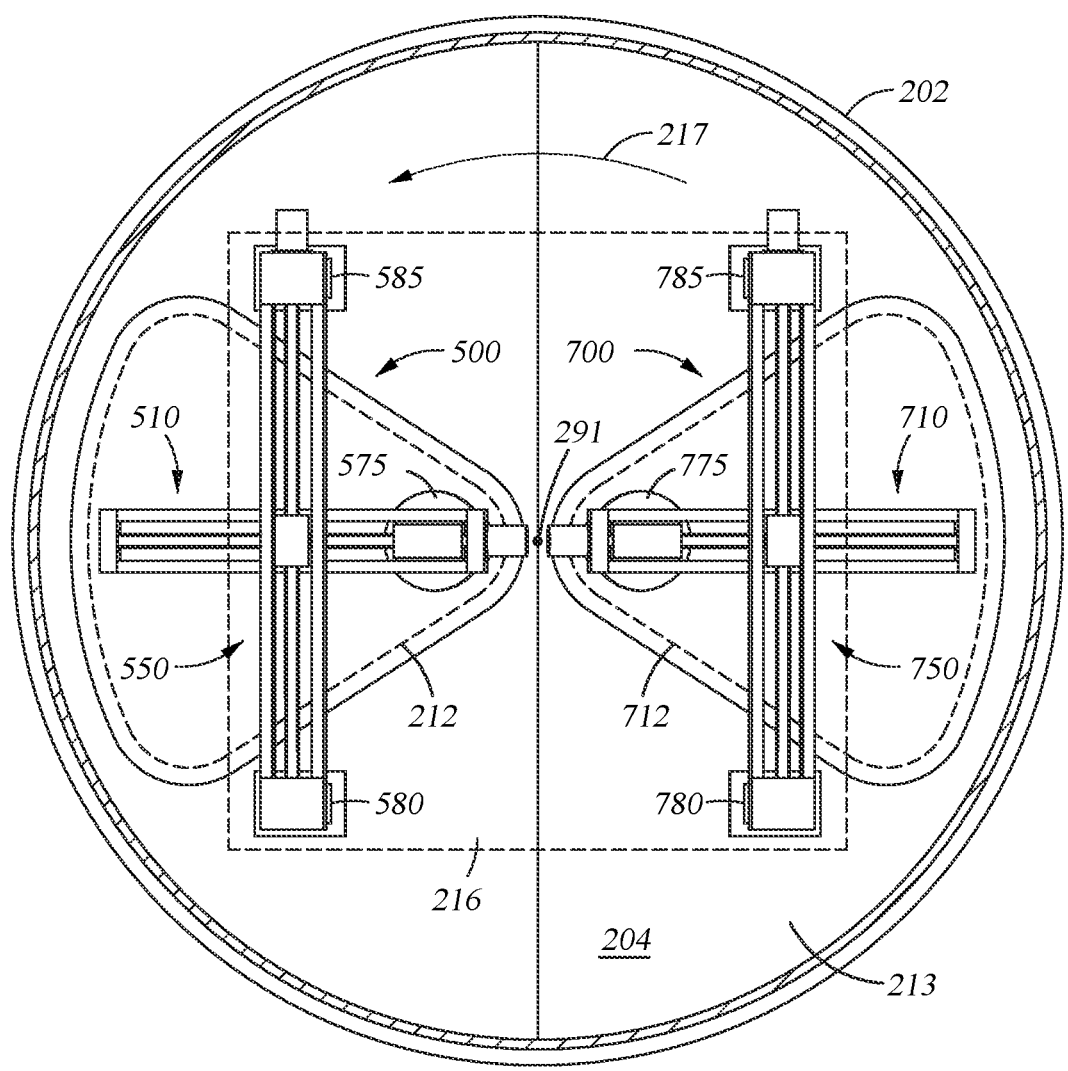
Fig. 5B
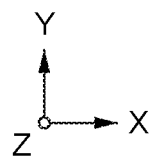

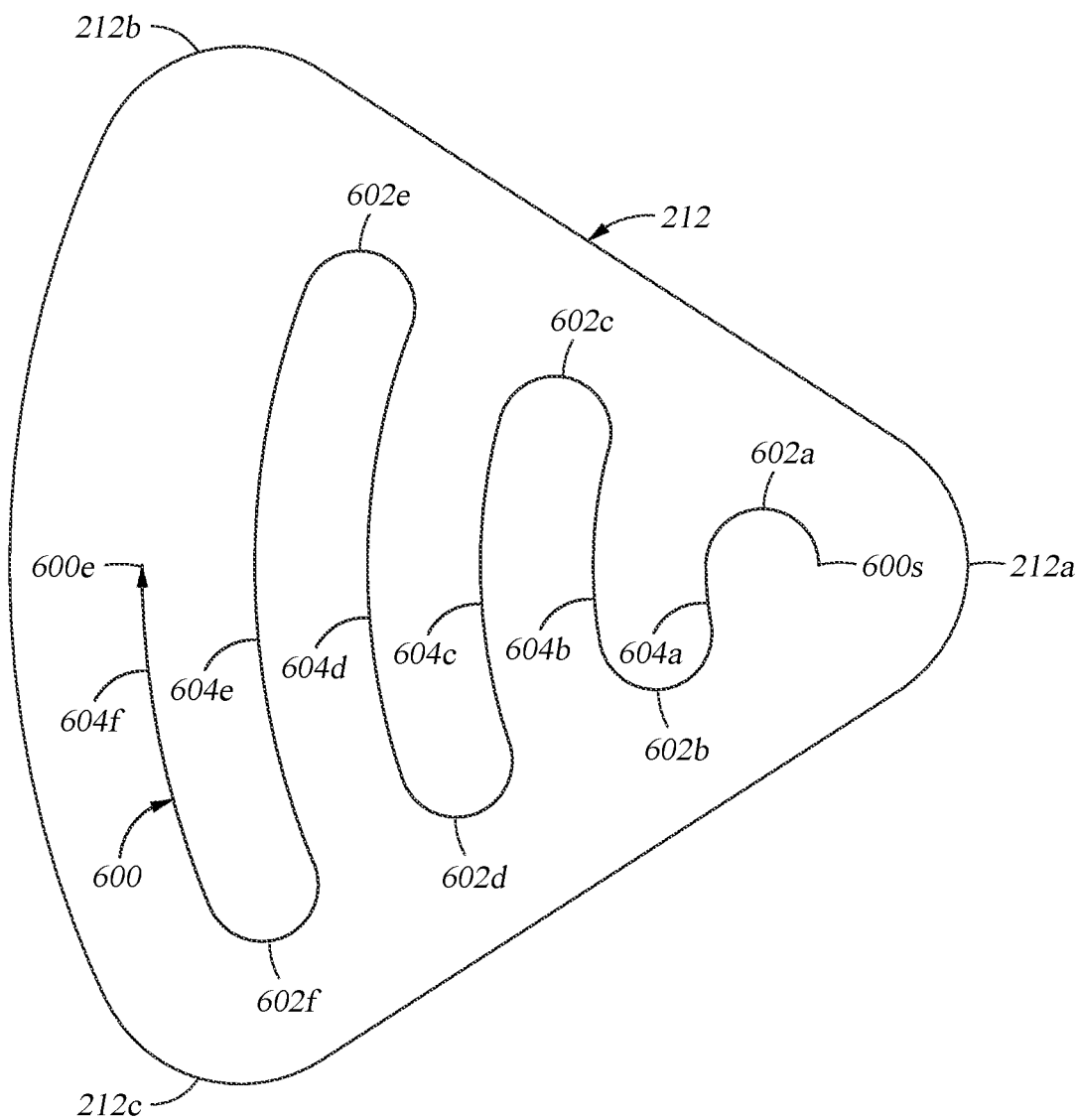
*Fig. 10*
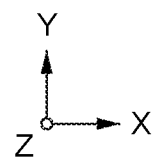

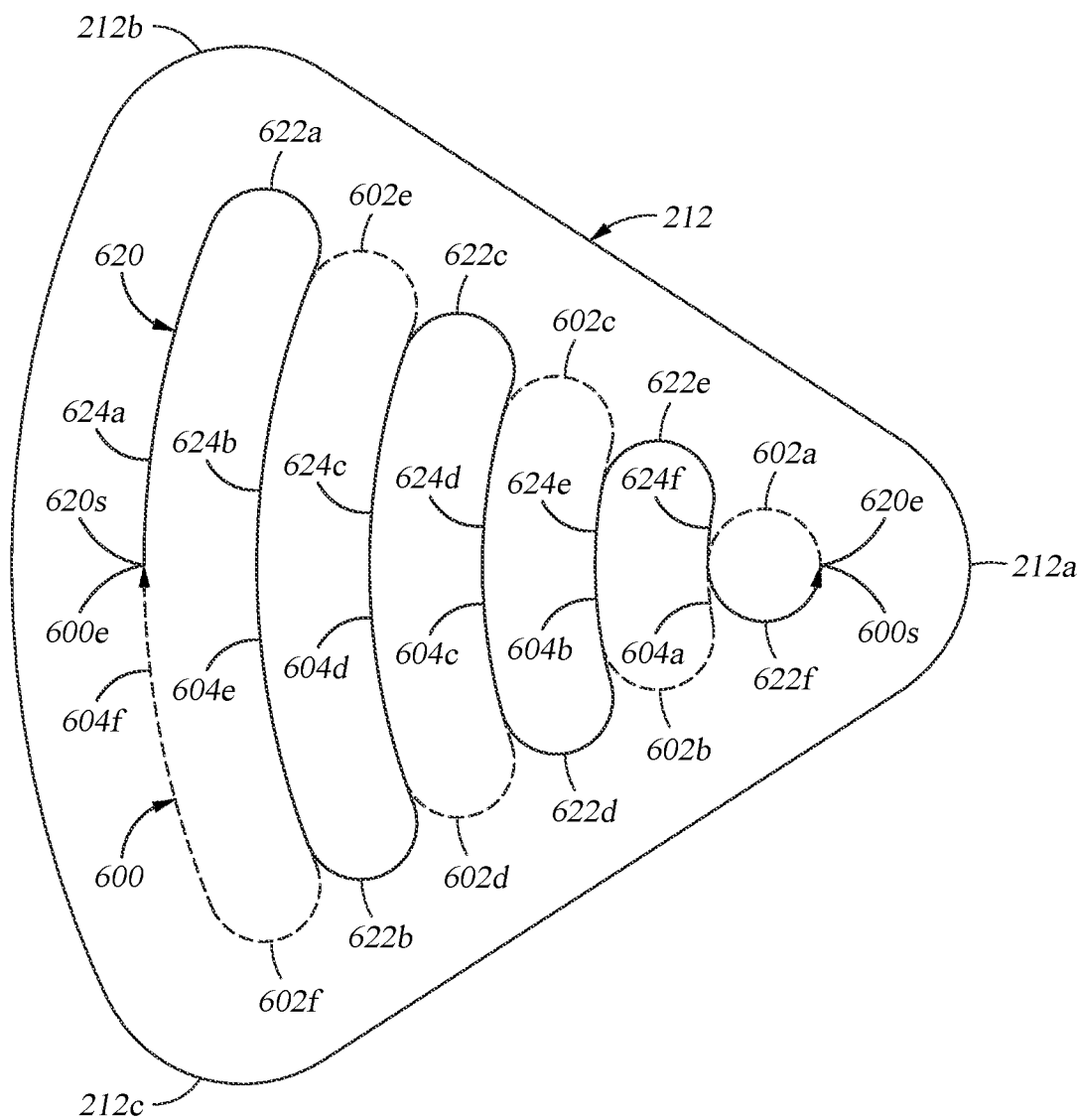
Fig. 11
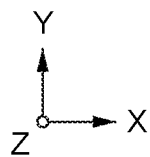

PHYSICAL VAPOR DEPOSITION SOURCE AND CHAMBER ASSEMBLY

BACKGROUND

Field

Embodiments of the present disclosure generally relate to physical vapor deposition (PVD) film formation on substrates in an electronic device fabrication process, and more particularly, to apparatus and methods for improving film deposition uniformity with improved target utilization.

Description of the Related Art

Electronic device fabrication processes today often involve the use of a physical vapor deposition (PVD), or sputtering, process in a dedicated PVD chamber. The source of the sputtered material may a planar or rotary sputtering target formed from pure metals, alloys, or ceramic materials. A magnet array, which is typically disposed within an assembly that is often referred to as a magnetron, is used to generate a magnetic field in the vicinity of the target. During processing, a high voltage is applied to the target to generate a plasma and enable the sputtering process. Because the voltage source is negatively biased, the target may also be referred to as the "cathode." The high voltage generates an electric field inside the PVD chamber that is used to enable sputtering of the target material and generate and emit electrons from the target that are used to generate and sustain a plasma near the underside of the target. The magnet array (e.g., magnetron) applies an external magnetic field that traps electrons and confines the plasma close to the target. The trapped electrons can then collide with and ionize the gas atoms disposed within the processing region of the PVD chamber. The collision between the trapped electron(s) and gas atoms will cause the gas atoms to emit electrons that are used to sustain and further increase the plasma density within the processing region of the PVD chamber. The plasma may include argon atoms, positively charged argon ions, free electrons, and ionized and neutral metal atoms sputtered from the target. The argon ions are accelerated towards the target due to the negative bias and collide with a surface of the target causing atoms of the target material to be ejected therefrom. The ejected atoms of target material then travel towards the substrate and chamber shielding to incorporate into the growing thin film thereon.

PVD sputtering and control of film uniformity are especially challenging when processing large-area substrates, such as panels. As used herein, the term "panel" may refer to a large-area substrate that contains a large surface area. For example, a common panel size may be 600 mm by 600 mm. In some packaging applications, common panel materials can include polymer materials, such as Ajinomoto Build-up Film (ABF), Copper Clad Laminate (CCL), panel with polymer on top, glass, or other similar materials.

PVD film formation on large-area substrates may be performed using either planar or rotary targets as described above. In either case, the target size may be greater than 800 mm in length and exceeds 1,000 mm in some cases. In other terms, the target size may be about 20% to about 40% greater than the size of a substrate being processed. The need for such large-area targets presents particular challenges to the PVD sputtering process. For example, for precious metals, the amount of raw material required to fabricate such large-area targets is very costly. On the other hand, large-area monolithic targets formed from relatively brittle materials, such as silicon, are difficult and costly to manufacture because of their tendency to crack or break. In addition, conventional PVD chambers are only sized to fit one large-area target at a time, which reduces throughput compared to what may be achievable if multiple targets were positioned within the process chamber to provide a uniform PVD film deposition on the surface of a panel or a substrate. Due to purity and metal structure requirements, target are generally expensive to manufacture. Moreover, conventional target and magnetron designs suffer from inefficient and/or non-uniform erosion of the target material during a PVD deposition process. Inefficient and/or non-uniform erosion of the target material during PVD deposition processes is larger problem for non-circular and/or non-symmetric target designs, which are commonly used in multiple target PVD chamber designs, due the required complex movements of a magnetron over a target surface during processing.

Accordingly, there is a need in the art for apparatus and methods for improving film deposition uniformity while also providing a more efficient utilization of the target material.

SUMMARY

Embodiments described herein generally relate to physical vapor deposition (PVD) film formation on substrates in an electronic device fabrication process. More particularly, embodiments described herein provide apparatus and methods for improving film uniformity through the improved utilization of target material.

In one embodiment, a magnetron translation assembly is provided with a first linear actuator assembly having a first mount positioned along a first rail, which is aligned in a first direction; and a first actuator configured to position the first mount along the first rail. A second linear actuator assembly includes a second mount to be positioned along a second rail which is aligned in a second direction that is perpendicular to the first direction, and the first linear actuator assembly is coupled to a mounting surface of the second mount. A second actuator is configured to position the second mount and the first linear actuator assembly along the second rail and a magnet assembly comprising an inner pole, wherein the inner pole piece and the outer pole piece are oriented parallel to a plane and have opposing magnetic polarities. A rotation actuator coupled between a mounting surface of the first mount of the first linear actuator assembly and the magnet assembly is provided wherein the rotation actuator is configured to rotate the magnet assembly about an axis that is perpendicular to the plane.

In one embodiment, a physical vapor deposition (PVD) chamber comprises a magnetron translation assembly including a first linear actuator assembly having a magnet assembly attached thereto and a second linear actuating assembly for supporting the first linear actuating assembly, a pedestal having an upper surface that is configured to support a substrate thereon is disposed within a processing region of the PVD chamber, a first motor is coupled to the pedestal, the first motor configured to rotate the pedestal about a second axis that is perpendicular to at least a portion of the upper surface of the pedestal; and a controller comprising memory for storing a program, the program comprising instructions when executed by a processor of the controller synchronize the movement of the first and second linear actuators in order to move the magnet in a predetermined path.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 5A is a top view of a portion of FIG. 2A illustrating a first magnetron translation assemblies over a rotating panel of substrates.

FIG. 5B is a top view of a portion of FIG. 2B illustrating a first and a second magnetron translation assembly over a rotating panel of substrates.

FIG. 10 is a top view of a delta-shaped target illustrating one path of a magnet assembly over the target, the magnet moved through operation of the magnetron translation assembly.

FIG. 11 is a top view of the delta-shaped target of FIG. 10 illustrating a more complete path of the magnet assembly.

Figure 1:
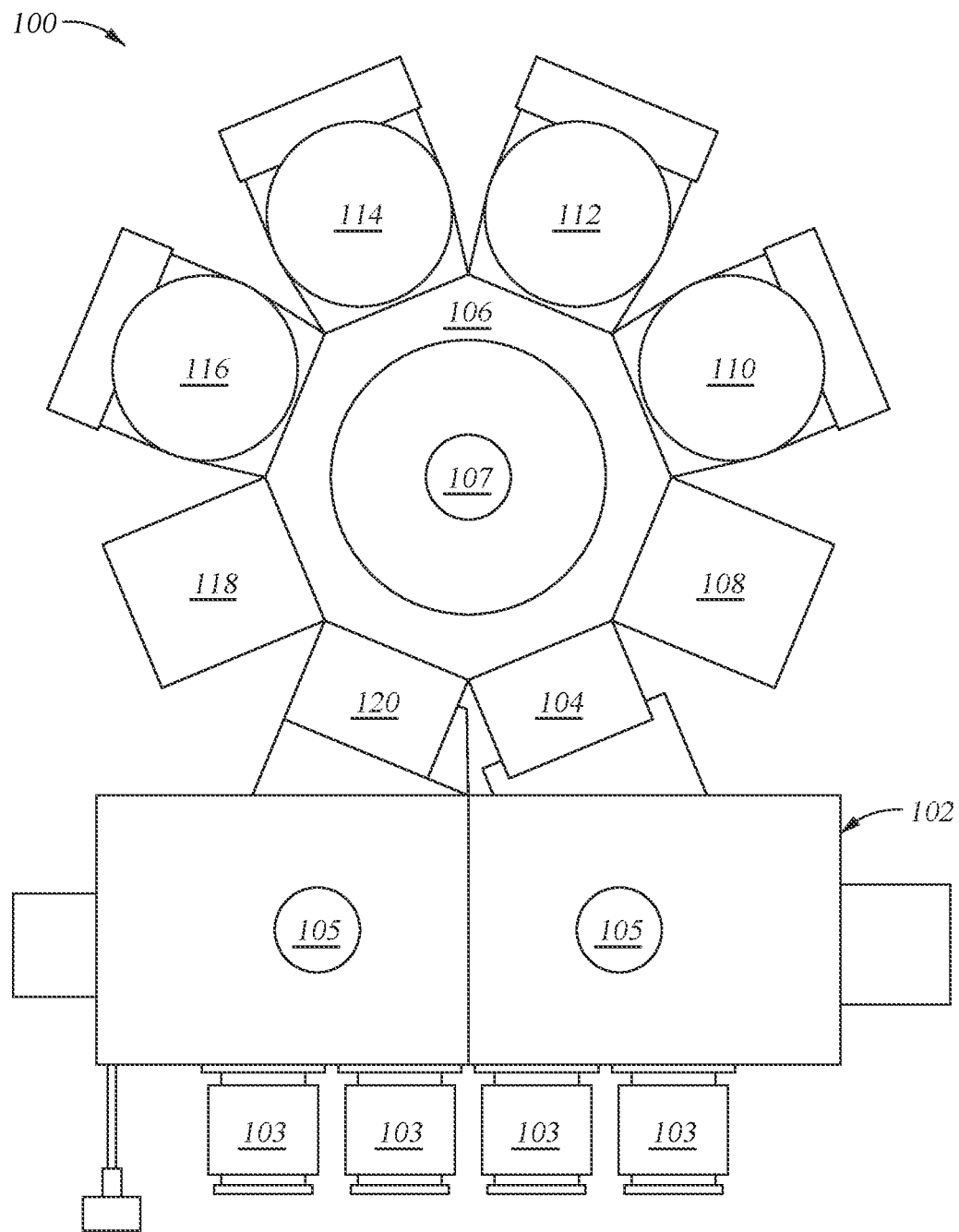
FIG. 1 is a schematic top view of an exemplary substrate processing system, according to certain embodiments.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

Embodiments of the disclosure provided herein generally relate to physical vapor deposition (PVD) of thin films on substrates in an electronic device fabrication process. More particularly, embodiments described herein provide apparatus and methods for improving film deposition uniformity when using a compact target, or also referred to herein as a compact cathode, cathode or target. In some embodiments, the apparatus may include substrate supporting elements that are configured to rotate the substrate during processing to improve the film uniformity using a compact target, which reduces the cost of the target compared to large-area targets described above. Embodiments of the disclosure provided herein can provide a target that is tilted in relation to the substrate being processed in order to improve film uniformity. Embodiments of the disclosure provided herein can also enable co-sputtering by use of two or more targets simultaneously, which can increase throughput versus the use of a single target, and allow the composition of the deposited film to be adjusted. Embodiments of the disclosure provided herein can also enable translational motion of the magnetron in two approximately perpendicular directions to extend a magnetic field generated by a magnetron across the sputtering service area of the target for full face erosion. In general, translational motion or oscillation helps the management of defects such as particles and arcing, and extends the life of the target compared to a fixed magnet where only certain areas of the target are eroded. Embodiments of the disclosure provided herein can also enable scanning of the magnetron along one or more paths across the backside surface of the target so that the uniformity of the deposited film can be controlled. For example, the scanning of the magnetron may be adjusted during the deposition process to compensate for any film thickness variation across different areas of the substrate.

Exemplary Substrate Processing System

FIG. 1 is a schematic top view of an exemplary substrate processing system 100 (also referred to as a "processing platform"), according to certain embodiments. In certain embodiments, the substrate processing system 100 is particularly configured for processing large-area substrates, such as panels as described above. The substrate processing system 100 generally includes an equipment front-end module (EFEM) 102 for loading substrates into the processing system 100, a first load lock chamber 104 coupled to the EFEM 102, a transfer chamber 106 coupled to the first load lock chamber 104, and a plurality of other chambers coupled to the transfer chamber 106 as described in detail below. The front-end module (EFEM) 102 generally includes one or more robots 105 that are configured to transfer substrates from the FOUPs 103 to at least one of the first load lock chamber 104 or the second load lock chamber 120. Proceeding counterclockwise around the transfer chamber 106 from the first load lock chamber 104, the processing system 100 includes a first dedicated degas chamber 108, a first pre-clean chamber 110, a first deposition chamber 112, a second pre-clean chamber 114, a second deposition chamber 116, a second dedicated degas chamber 118, and a second load lock chamber 120. In certain embodiments, the transfer chamber 106 and each chamber coupled to the transfer chamber 106 are maintained at a vacuum state. As used herein, the term "vacuum" may refer to pressures less than 760 Torr, and will typically be maintained at pressures near $10^{-5}$ Torr (i.e., ~$10^{-3}$ Pa). However, some high-vacuum systems may operate below near $10^{-7}$ Torr (i.e., ~$10^{-5}$ Pa). In certain embodiments, the vacuum is created using a rough pump and/or a turbomolecular pump coupled to the transfer chamber 106 and to each of the one or more process chambers (e.g., process chambers 108-118). However, other types of vacuum pumps are also contemplated.

In certain embodiments, substrates are loaded into the processing system 100 through a door (also referred to as an "access port"), in the first load lock chamber 104 and unloaded from the processing system 100 through a door in the second load lock chamber 120. In certain embodiments, a stack of substrates is supported in a cassette disposed in the FOUP, and are transferred therefrom by a robot 105 to the first load lock chamber 104. Once vacuum is pulled in the first load lock chamber 104, one substrate at a time is retrieved from the load lock chamber 104 using a robot 107 located in the transfer chamber 106. In certain embodiments, a cassette is disposed within the first load lock chamber 104 and/or the second lock chamber 120 to allow multiple substrates to be stacked and retained therein before being received by the robot 107 in the transfer chamber 106 or robot 105 in the EFEM 102. However, other loading and unloading configurations are also contemplated.

Pre-cleaning of the substrates is important to remove impurities, such as oxides, from the substrate surface, so that films (e.g., metal films) deposited in the deposition chambers are not electrically insulated from the electrically-conductive metal surface area of the substrate by the layer of impurities. By performing pre-cleaning in the first and second pre-clean chambers 110, 114, which share the vacuum environment similar to the first and second deposition chambers 112, 116, the substrates can be transferred from the cleaning chambers to the deposition chambers without being exposed to atmosphere. This prevents formation of impurities on the substrates during the transfer. In addition, vacuum pump-down cycles are reduced since a vacuum is maintained in the substrate processing system 100 during transfer of the cleaned substrates to the deposition chambers. In some embodiments, when a cassette is empty or full in the first load lock chamber 104 or the second load lock chamber 120 the processing system 100 may cause either of the load lock chambers to break vacuum so that one or more substrate can be added or removed therefrom.

In certain embodiments, only one substrate is processed within each pre-clean and deposition chamber at a time. Alternatively, multiple substrates may be processed at one time, such as four to six substrates. In such embodiments, the substrates may be disposed on a rotatable pallet within the respective chambers. In certain embodiments, the first and second pre-clean chambers 110, 114 are inductively coupled plasma (ICP) chambers for etching the substrate surface. However, other types of pre-clean chambers are also contemplated. In certain embodiments, one or both of the pre-clean chambers are replaced with a film deposition chamber that is configured to perform a PVD, chemical vapor deposition (CVD), or atomic layer deposition (ALD) process, such as deposition of silicon nitride.

In a pre-clean chamber that includes an ICP source, a coil at the top of the chamber is energized with an external RF source to create an excitation field in the chamber. A pre-clean gas (e.g., argon, helium) flows through the chamber from an external gas source. The pre-clean gas atoms in the chamber are ionized (charged) by the delivered RF energy. In some embodiments, the substrate is biased by a RF biasing source. The charged atoms are attracted to the substrate resulting in the bombardment and/or etching of the substrate surface. Other gases besides argon may be used depending on the desired etch rate and the materials to be etched.

In certain embodiments, the first and second deposition chambers 112, 116 are PVD chambers. In such embodiments, the PVD chambers may be configured to deposit copper, titanium, aluminum, gold, and/or tantalum. However, other types of deposition processes and materials are also contemplated.

Exemplary PVD Chamber and Method of Use

Figure 2A:
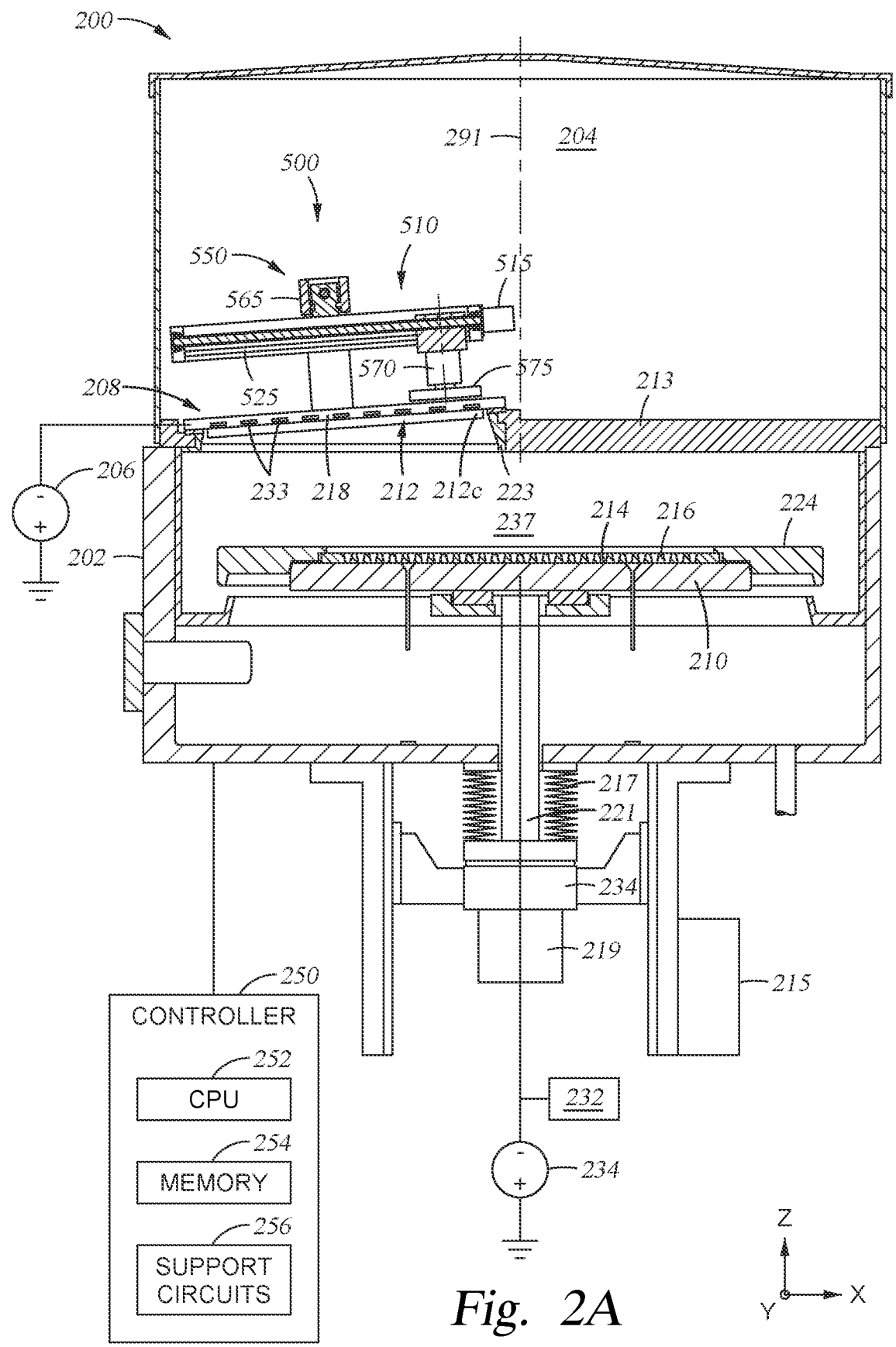
FIG. 2A is a side cross-sectional view of a PVD chamber including a magnetron translation assembly that may be used in the substrate processing system of FIG. 1, according to certain embodiments.
Figure 2B:
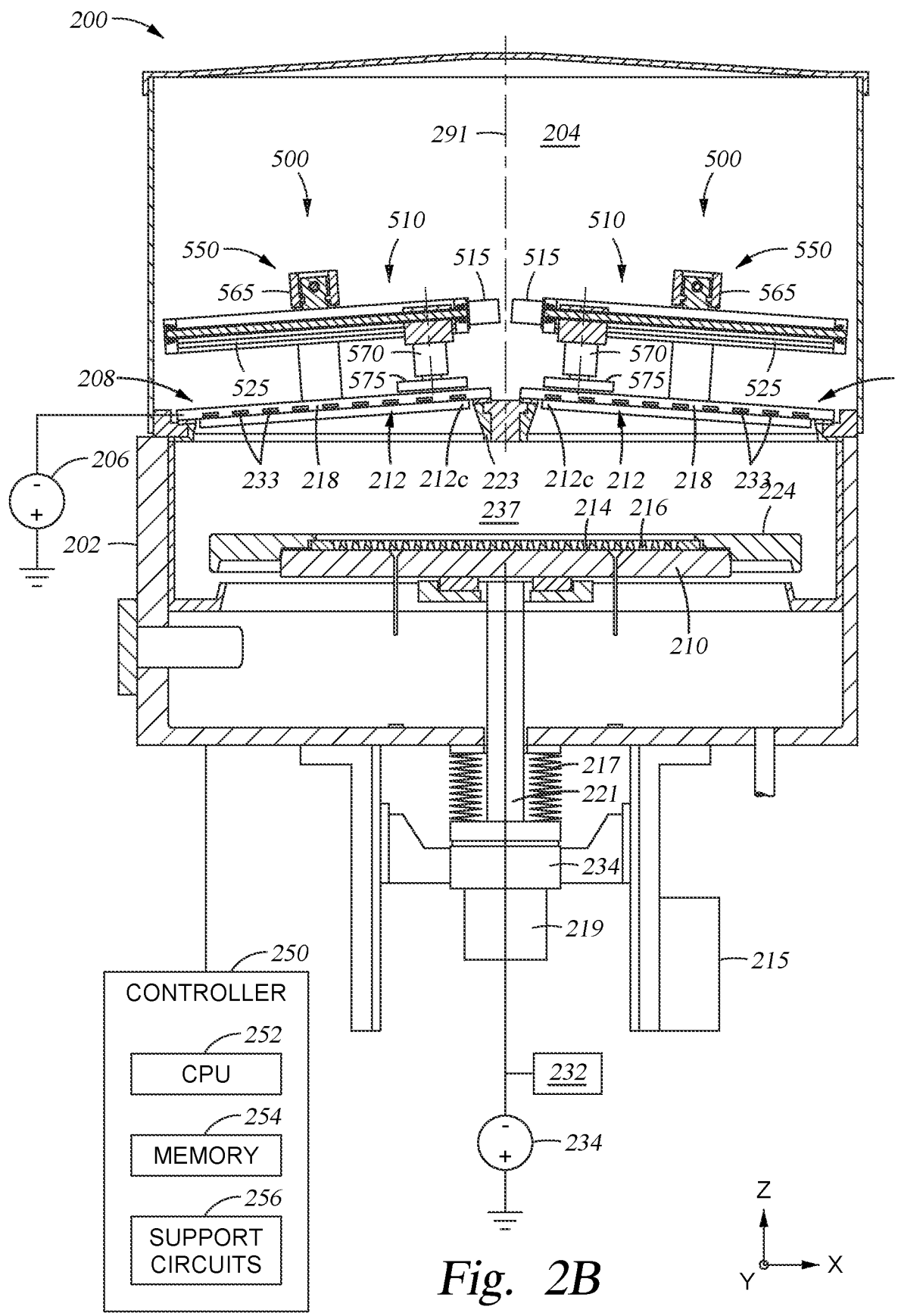
FIG. 2B is a side cross-sectional view of a PVD chamber including two magnetron translation assemblies that may be used in the substrate processing system of FIG. 1, according to certain embodiments.
Figure 3:
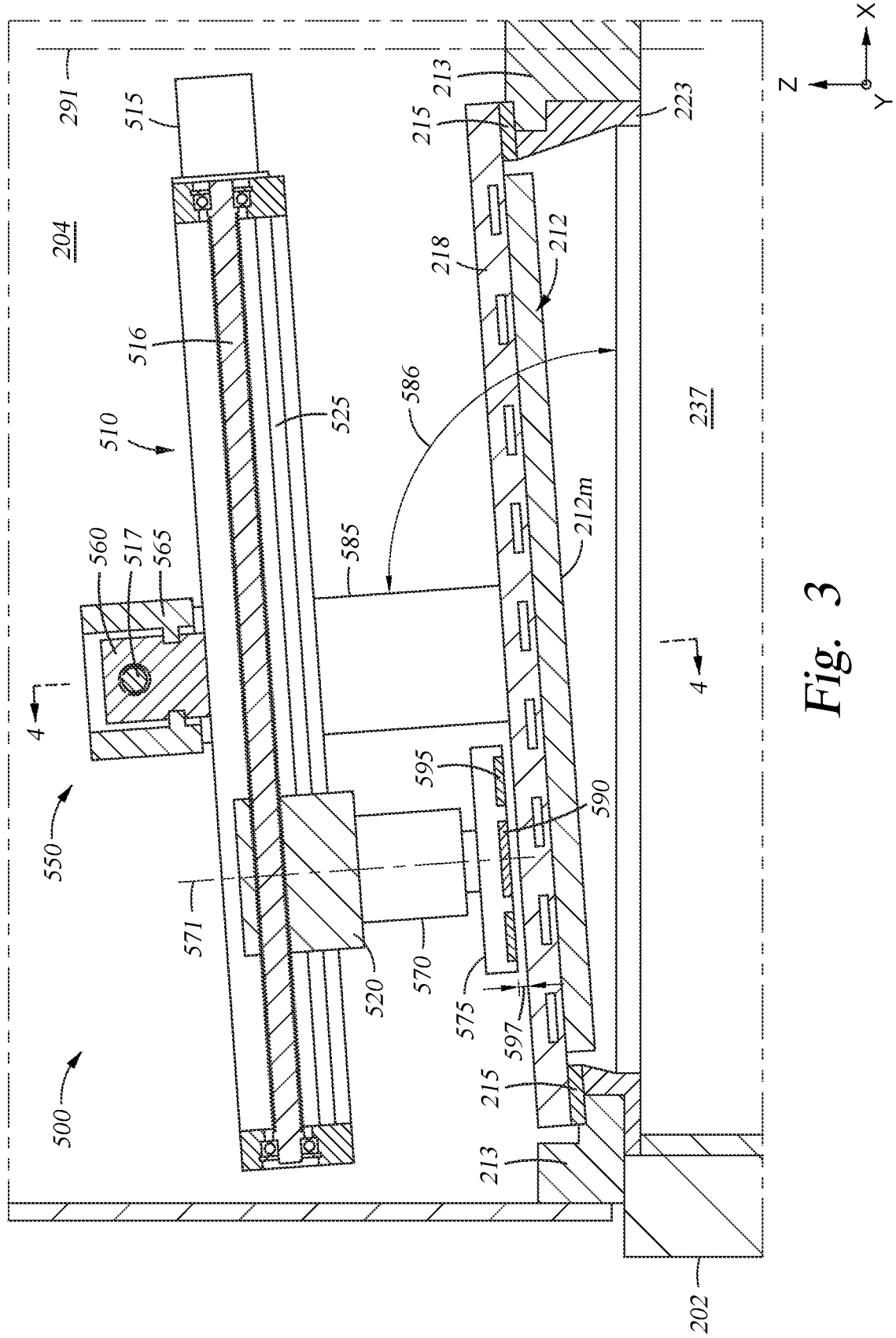
FIG. 3 is an enlarged cross-sectional view of a portion of the PVD chamber of FIG. 2A, illustrating a first linear actuating assembly of a magnetron translation assembly according to certain embodiments.

FIGS. 2A, 2B are side cross-sectional views of a PVD chamber 200 that may be used in the substrate processing system 100 of FIG. 1, according to certain embodiments. For example, the PVD chamber 200 may represent either one of the first or second deposition chambers 112, 116 shown in FIG. 1. Alternatively, the PVD chamber 200 may represent an additional deposition chamber. FIG. 3 is an enlarged cross-sectional view of a portion of the PVD chamber 200 of FIG. 2A, according to certain embodiments. FIGS. 2A, 2B and 3 are, therefore, described together herein for clarity.

The PVD chamber 200 generally includes a chamber body 202, a lid assembly 204 coupled to the chamber body 202, a magnetron with a magnet assembly 575 within the lid assembly 204, a pedestal 210 disposed within the chamber body 202, and a target 212 disposed between the magnet assembly 575 and the pedestal 210. During processing, the interior of the PVD chamber 200, or processing region 237, is maintained at a vacuum pressure. The processing region 237 is generally defined by the chamber body 202 and the lid assembly 204, such that the processing region 237 is primarily disposed between the target 212 and the substrate supporting surface of the pedestal 210.

A power source 206 is electrically connected to the target 212 to apply a negative biased voltage to the target 212. In certain embodiments, the power source 206 is either a straight DC mode source or a pulsed DC mode source. However, other types of power sources are also contemplated, such as radio frequency (RF) sources.

The target 212 includes a target material 212M and a backing plate 218, and is part of the lid assembly 204. A front surface of the target material 212M of the target 212 defines a portion of the processing region 237. The backing plate 218 is disposed between the magnet assembly 575 and target material 212M (FIG. 3) of the target 212, wherein, in some embodiments, the target material 212M is bonded to the backing plate 218. Typically, the backing plate 218 is an integral part of the target 212 and thus for simplicity of discussion the pair may be referred to collectively as the "target." The backing plate 218 is electrically insulated from the support plate 213 of the lid assembly 204 by use of an electrical insulator 215 to prevent an electrical short being created between the backing plate 218 and the support plate 213 of the grounded lid assembly 204. As shown in FIGS. 2A, 2B, the backing plate 218 has a plurality of cooling channels 233 configured to receive a coolant (e.g., DI water) therethrough to cool or control the temperature of the target 212. In certain embodiments, the backing plate 218 may have one or more cooling channels. In some examples, the plurality of cooling channels 233 may be interconnected and/or form a serpentine path through the body of the backing plate 218. A shield 223 is coupled to the support plate 213. The shield 223 prevents material sputtered from the target 212 from depositing a film on the support plate 213. In some embodiments, the magnet assembly 575 and target 212, which includes the target material 212M and backing plate 218, each have a triangular or delta-shape, such that a lateral edge of the target 212 includes three corners (e.g., three rounded corners shown in FIGS. 5-11). As illustrated in FIGS. 5A, B, the target 212 is oriented such that a tip of a corner of the triangular or delta-shaped target is at or adjacent to the center axis 291. When viewed in a planar orientation view, as shown in FIGS. 5A, B, the surface area of the target 212 is less than the surface area of the substrate 216. In some embodiments, a surface area of the upper surface of the pedestal is greater than a surface area of the front surface of the target 212. In some embodiments, the ratio of the surface areas of the front surface of the target 212 to the deposition surface of the substrate 216 (e.g., upper surface of the substrate) is between about 0.1 and about 0.4.

As shown in FIGS. 2A, 2B, the magnet assembly 575 is disposed over a portion of the target 212, and in a region of the lid assembly 204 that is maintained at atmospheric pressure. The magnet poles 590, 595 of the assembly 575 are arranged in one or more closed loops, each of which will be in communication with permanent magnets that are positioned and oriented relative to their pole (i.e., north (N) and south (S) poles) so that a magnetic field spans from one magnet pole to the next or between different portions of a loop. In certain embodiments, the magnet assembly 575 may include a plurality of electromagnets in place of the permanent magnets utilized with the magnet poles 590, 595.

The pedestal 210 has an upper surface 214 supporting a substrate 216. A clamp 224 is used to hold the substrate 216 on the upper surface 214. In certain embodiments, the clamp 224 operates mechanically. For example, the weight of the clamp 224 may hold the substrate 216 in place. In certain embodiments, the clamp 224 is lifted by pins that are movable relative to the pedestal 210 to contact an underside of the clamp 224.

In this example, the backside of the substrate 216 is in contact with the upper surface 214 of the pedestal 210. In some examples, the entire backside of the substrate 216 may be in electrical and thermal contact with the upper surface 214 of the pedestal 210. The temperature of the substrate 216 may be controlled using a temperature control system 232. In certain embodiments, the temperature control system 232 has an external cooling source that supplies coolant to the pedestal 210. In some embodiments, the external cooling source is configured to deliver a cryogenically cooled fluid (e.g., Galden®) to heat exchanging elements (e.g., coolant flow paths) within a substrate supporting portion of the pedestal 210 that is adjacent to the upper surface 214, in order to control the temperature of the substrate to a temperature that is less than 20° C., such as less than 0° C., such as about −20° C. or less. In certain embodiments, the temperature control system 232 includes a heat exchanger and/or backside gas flow within the pedestal 210. In some examples, the cooling source may be replaced or augmented with a heating source to increase the workpiece temperature independent of the heat generated during the sputtering process. Controlling the temperature of the substrate 216 is important during the sputtering process to obtain a predictable and reliable thin film. In certain embodiments, a RF bias source 234 is electrically coupled to the pedestal 210 to bias the substrate 216 during the sputtering process. Alternatively, the pedestal 210 may be grounded, floated, or biased with only a DC voltage source. Biasing the substrate 216 can improve film density, adhesion, and material reactivity on the substrate surface.

A pedestal shaft 221 is coupled to an underside of the pedestal 210. A rotary union 219 is coupled to a lower end of the pedestal shaft 221 to provide rotary fluid coupling with the temperature control system 232 and rotary electrical coupling with the RF bias source 234. In certain embodiments, a copper tube is disposed through the pedestal shaft 221 to couple both fluids and electricity to the pedestal 210. The rotary union 219 includes a magnetic liquid rotary sealing mechanism (also referred to as a "Ferrofluidic® seal") for vacuum rotary feedthrough.

In this example, the substrate 216 is a panel. In certain embodiments, the upper surface 214 of the pedestal 210 fits a single square or rectangular panel substrate having sides of about 500 mm or greater, such as 510 mm by 515 mm or 600 mm by 600 mm. However, apparatus and methods of the present disclosure may be implemented with many different types and sizes of substrates.

In certain embodiments, the pedestal 210 is rotatable about an axis 291 perpendicular to at least a portion of the upper surface 214 of the pedestal 210. In this example, the pedestal 210 is rotatable about a vertical axis, which corresponds to the z-axis. In certain embodiments, rotation of the pedestal 210 is continuous without indexing. In other words, a motor 231 driving rotation of the pedestal 210 does not have programmed stops for rotating the substrate 210 to certain fixed rotational positions. Instead, the pedestal 210 is rotated continuously in relation to the target 212 to improve film uniformity. In certain embodiments, the motor 231 is an electric servo motor. The motor 231 may be raised and lowered by a separate motor 215. The motor 215 may be an electrically powered linear actuator. A bellows 217 surrounds the pedestal shaft and forms a seal between the chamber body 202 and the motor 231 during raising and lowering of the pedestal 210.

An underside surface of the target 212, which is defined by a surface of a target material 212M, faces towards the upper surface 214 of the pedestal 210 and towards a front side of the substrate 216. The underside surface of the target 212 faces away from the backing plate 218, which faces towards the atmospheric region or external region of the PVD chamber. In certain embodiments, the target materials 212M of the target 212 is formed from a metal for sputtering a corresponding film composition on the substrate 216. In one example, the target materials 212M may include a pure material or alloy containing elements selected from the group of copper (Cu), molybdenum (Mo), nickel (Ni), titanium (Ti), tantalum (Ta), aluminum (Al), cobalt (Co), gold (Au), silver (Ag), manganese (Mn), and silicon (Si). The materials deposited on a substrate 216 by the methods described herein may include pure metals, doped metals, metal alloys, metal nitrides, metal oxides, metal carbides containing these elements, as well as silicon containing oxides, nitrides or carbides. In this example, the pedestal 210 is substantially horizontal, or parallel to the x-y plane, whereas the target 212 is non-horizontal, or tilted in relation to the x-y plane. However, other non-horizontal orientations of the pedestal 210 are also contemplated.

Figure 4:
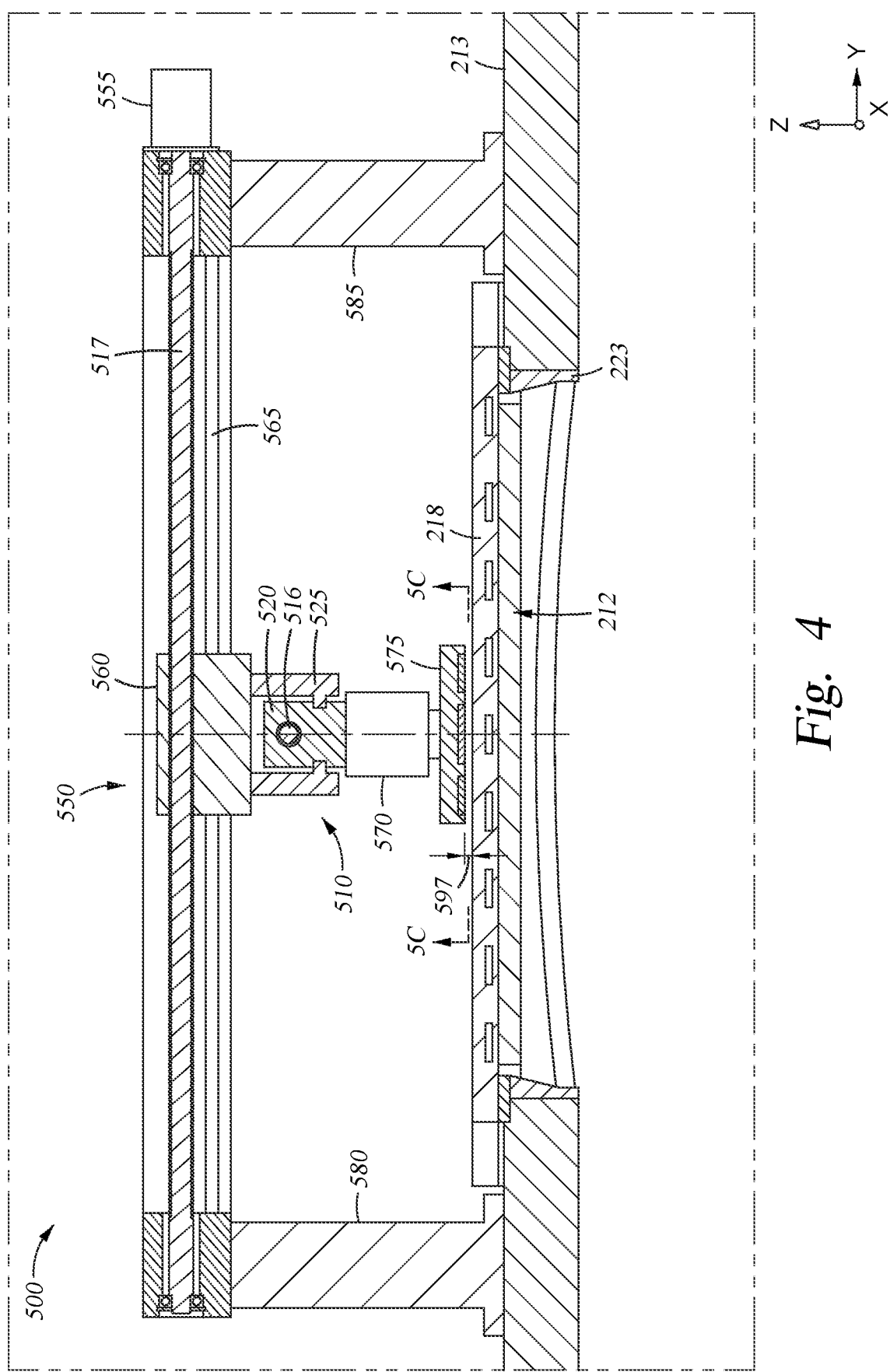
FIG. 4 is an enlarged cross-sectional view of a portion of the PVD chamber taken along a line 4-4 of FIG. 3 and illustrating a second linear actuating assembly of a magnetron translation assembly.

The magnetron translation assembly 500 is coupled to the lid assembly 204 and is visible in FIGS. 3 and 4 and for clarity. In one embodiment, the assembly 500 as well as the target 212 is tilted at an angle 586 as shown in FIG. 3. In certain embodiments, the angle 586 is between about 2° and about 10°, such as between about 3° and about 5°. The assembly 500 includes a first and second linear actuator assemblies 510, 550 that, in the embodiment shown, are perpendicular to one another. The first linear actuator assembly 510 includes a first actuator 515, in one embodiment a motor constructed and arrange to rotate a first lead screw 516 in order to provide linear movement to a first mount 520 along a first rail 525. In certain embodiments, the first actuator 515 is an electric motor. Alternatively, a pneumatic motor may be used. In some examples, the first actuator 515 and other actuators used in the assembly may be a servo or stepper motor. In some examples, the actuators may be a direct drive motor, a belt drive motor, or a gear drive motor.

Mounted below the first mount 520 and a predetermined distance above the target 212 is a rotational actuator 570 for rotating a magnet assembly 575 mounted therebelow. The magnet assembly 575 includes an array of magnets that are separately coupled to an inner pole 590 and outer pole 595. The longitudinal axis 571 of the rotational actuator is perpendicular to the tilted angle 586 of the first linear actuator assembly 510. By operating the first actuator 515, the lead screw 516 causes the first mount 520 and the magnet assembly 575 to move between a first and second ends of the first rail 525.

FIG. 4 is an enlarged cross-sectional view of a portion of the PVD chamber 200 taken along a line 4-4 of FIG. 3 and illustrating the second linear actuating assembly 550 of a magnetron translation assembly 500. In an effort to avoid confusion, the angle of the sectioning line 4-4 is oriented perpendicular to face of the target 212 and thus is oriented at the tilt angle of the target 212 relative to the vertical direction (Z-direction), and thus the magnetron translation assembly 500 and target 212 are shown in a horizontal orientation in FIG. 4. A second rail 565 extends between a first 580 and second 585 supports and includes a second mount 560 constructed and arranged to carry the first linear actuator assembly 510 along a second lead screw 517 by means of a second actuator 555. FIG. 5A is a top view of a portion of FIG. 2A illustrating a magnetron translation assembly 500 and target 212 over a rotating substrate 216. The direction of rotation is shown by arrow 217. In the embodiment shown, the substrate 216 is a square panel. As shown in FIG. 5B, a process chamber 200 can include two magnetron translation assemblies 500, 700. The second assembly 700 includes its own first and second linear actuators 710, 750. In FIG. 5B the magnet assemblies 575, 775 of each translation assembly 500, 700 are shown in the same location in relation to targets 212, 712. It will be understood however, that since both assemblies 575, 775 are processing the same rotating substrate, the coordination between the two magnet assemblies 575, 775 may or may not have them in similar, differing and/or opposing positions at all times or even at any one time. In one embodiment, both assemblies do move in an equal and opposing manner across the target as shown in FIGS. 6-9. However in another embodiment, the magnet assemblies 575, 775 operate on different portion of their targets 212, 712 and do not share a path that would result in a doubling of sputtered material being applied to the same area of the substrate. In some embodiments, the location and movement of the magnet assemblies 575, 775 is a process variable in addition to rotational speed, linear speed and distance of the magnets from the target 212.

One purpose of the design of the magnetron translation assembly 500 is to facilitate an even erosion of the target material in a manner that improves the utilization of the target and more evenly deposits the material onto the substrate 216. FIGS. 6-9 are top views of a magnetron translation assembly 500 over a delta-shaped target 212 illustrating the various positions of a magnet assembly 575 relative to the linear actuator assemblies 510, 550 and the target 212. By combining movements of the linear actuating assemblies 510, 550, the rotating magnet assembly 575 can be moved over the target 212 in a manner that ensures target material is eroded evenly and the uniformity of the deposited material on the rotating substrate can be achieved. It should be noted that uniform target erosion does not necessarily ensure uniform deposition on the substrate during a substrate deposition process. Therefore, it is believed that the coordination of the translation motion of the magnet assembly 575 over the non-symmetric shaped target and speed of the rotation of the substrate the two competing deposition process goals (i.e., uniform target erosion and uniform deposition) can be achieved.

Figure 5C:
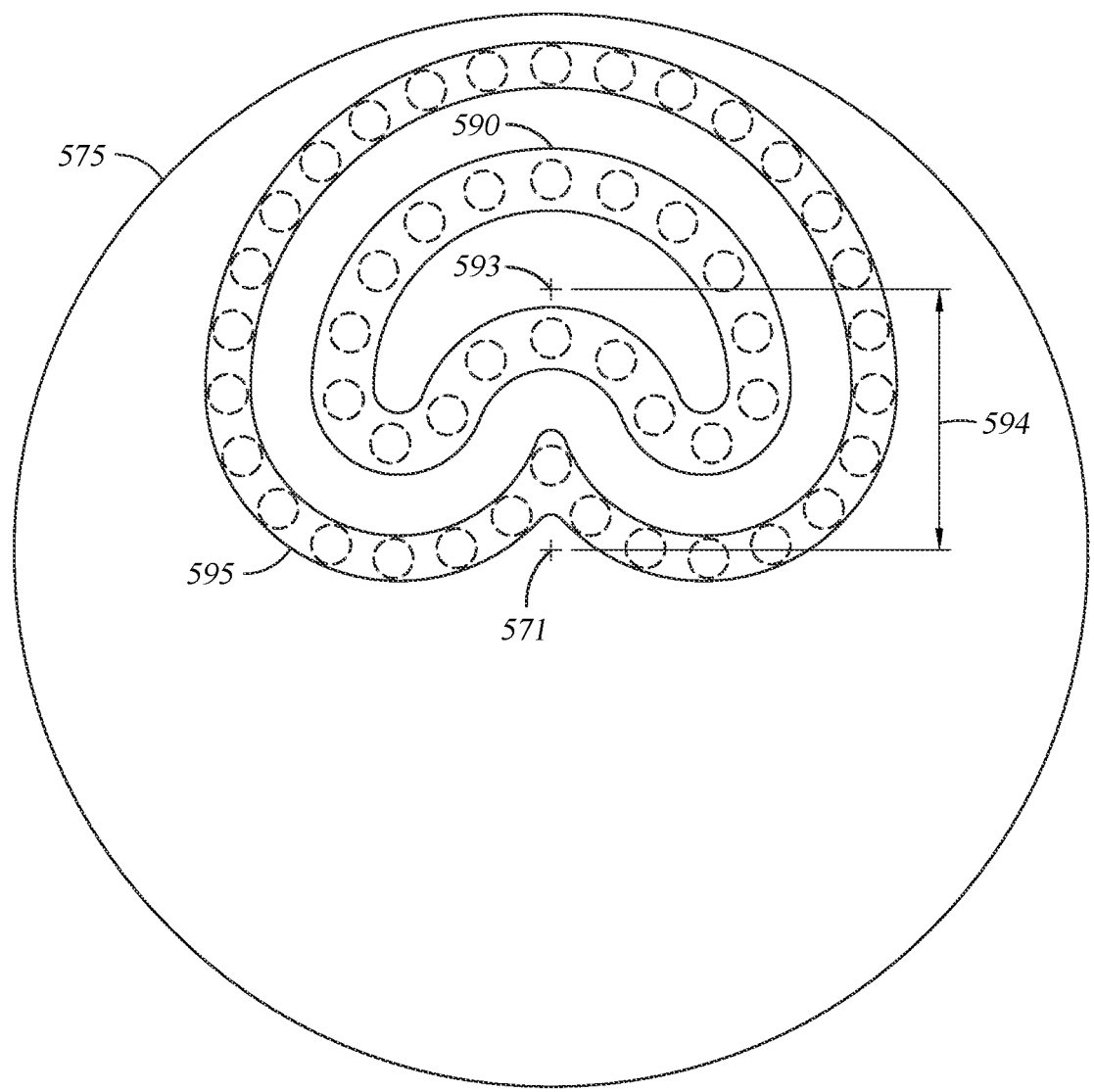
FIG. 5C is a view of the underside of a magnet assembly associated with a magnetron translation assembly.

FIG. 5C is a view of the underside of a magnet assembly 575 associated with a magnetron translation assembly 500. Visible are the circular end-shapes of inner and outer magnet poles 590, 595 as well as a distance 594 from the centerline of the magnet assembly to the centerline 593 or centroid of the magnet poles. Due to the fact that the magnet poles are positioned to one side of the magnetron assembly 575 (i.e., non-symmetrically positioned and offset relative to the axis 571), the speed of rotation of the assembly can be important to cause an even removal of target material and correlating the rotation of the assembly 575 with its linear speed across the target 212 can control the uniform exposure to portions of the plasma formed over a surface of the target, due to the controlled by the movement and rotation of the magnetron assembly 575. In addition to the rotational speed of the magnet assembly 575 about the axis 571, the distance 597 (FIGS. 3, 4) of the spacing of the magnet poles relative to the surface of the target can be important in determining the intensity of the magnetic fields and thus the density of the plasma generated over the surface of the target. In one embodiment, the distance is set in coordination with linear translation and rotational speed of the magnetron assembly 575 to accomplish a predetermined deposition rate of target material onto a substrate.

Figure 6:
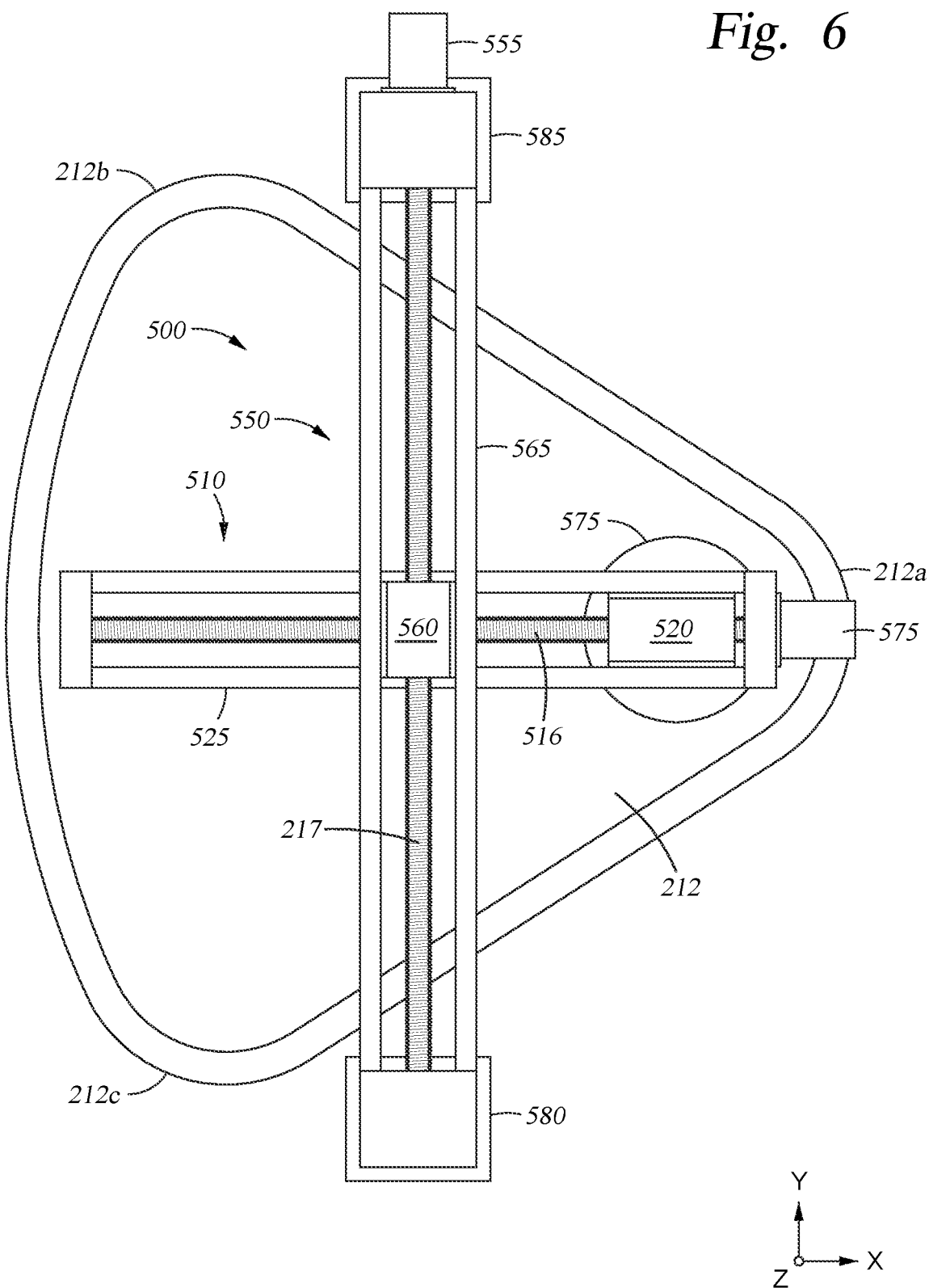
FIGS. 6-9 are top views of a magnetron translation assembly over a delta-shaped target illustrating the various positions of a magnet assembly relative to the translation assembly and the target.
Figure 7:
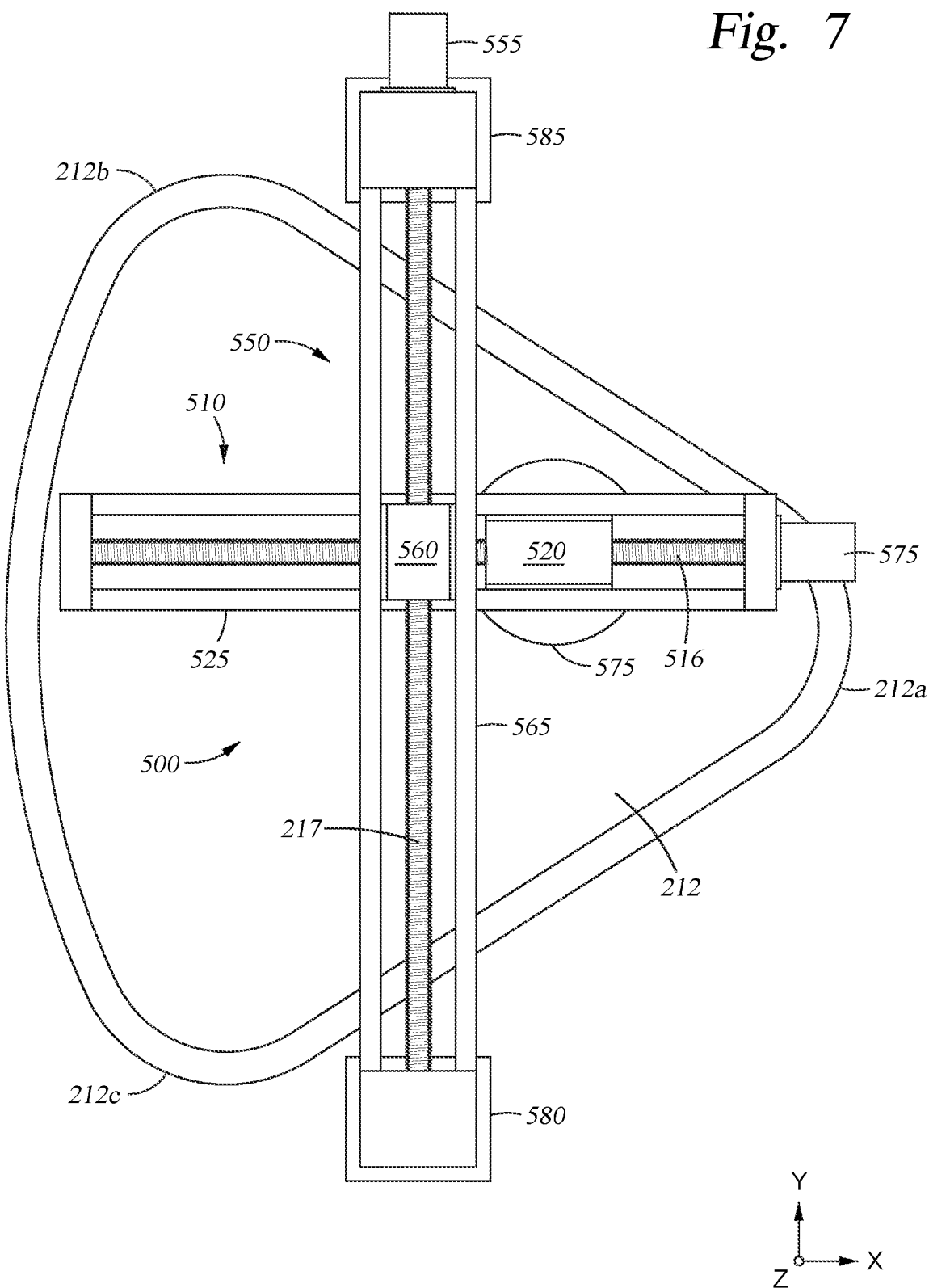
Figure 8:
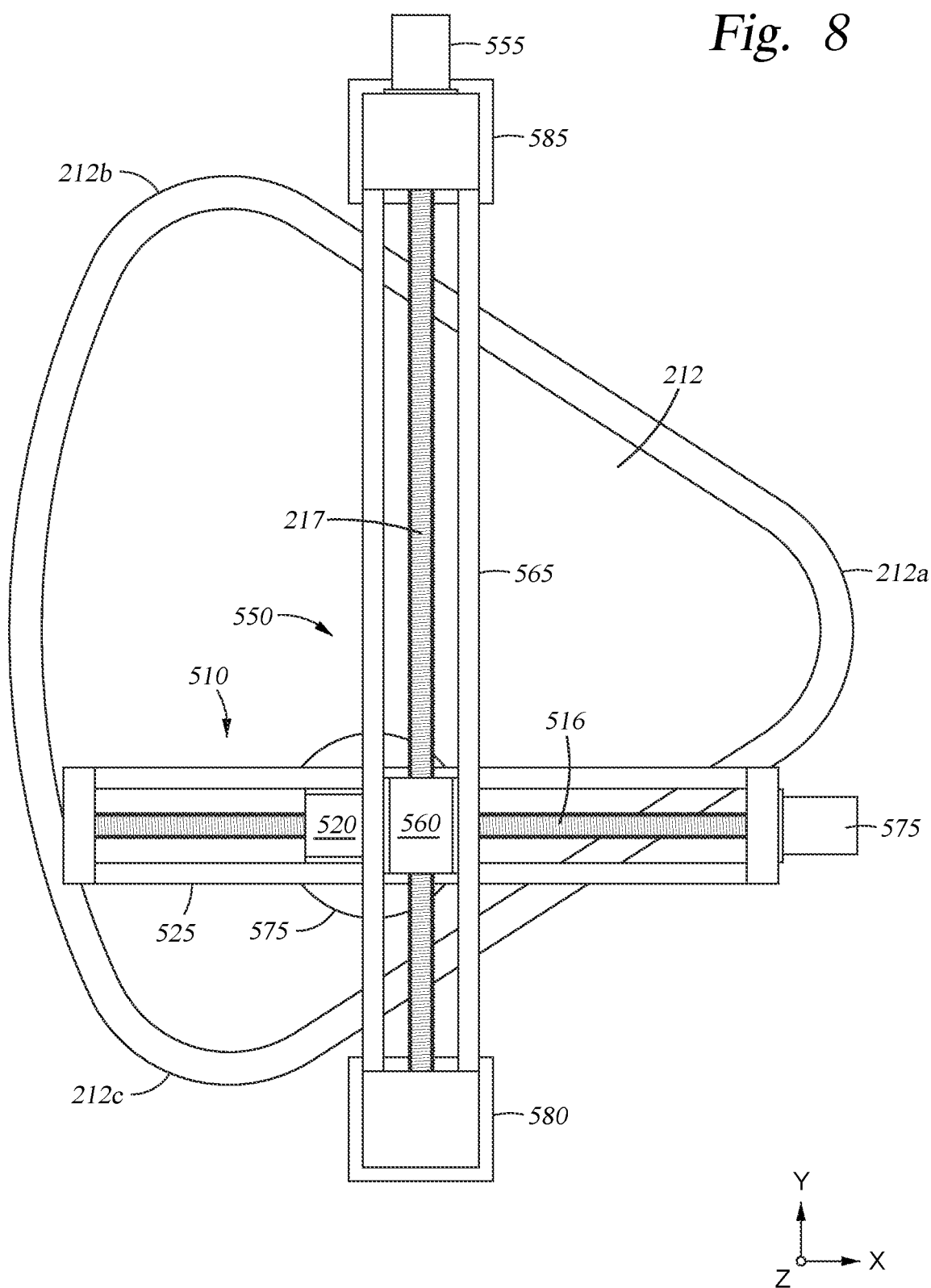
Figure 9:
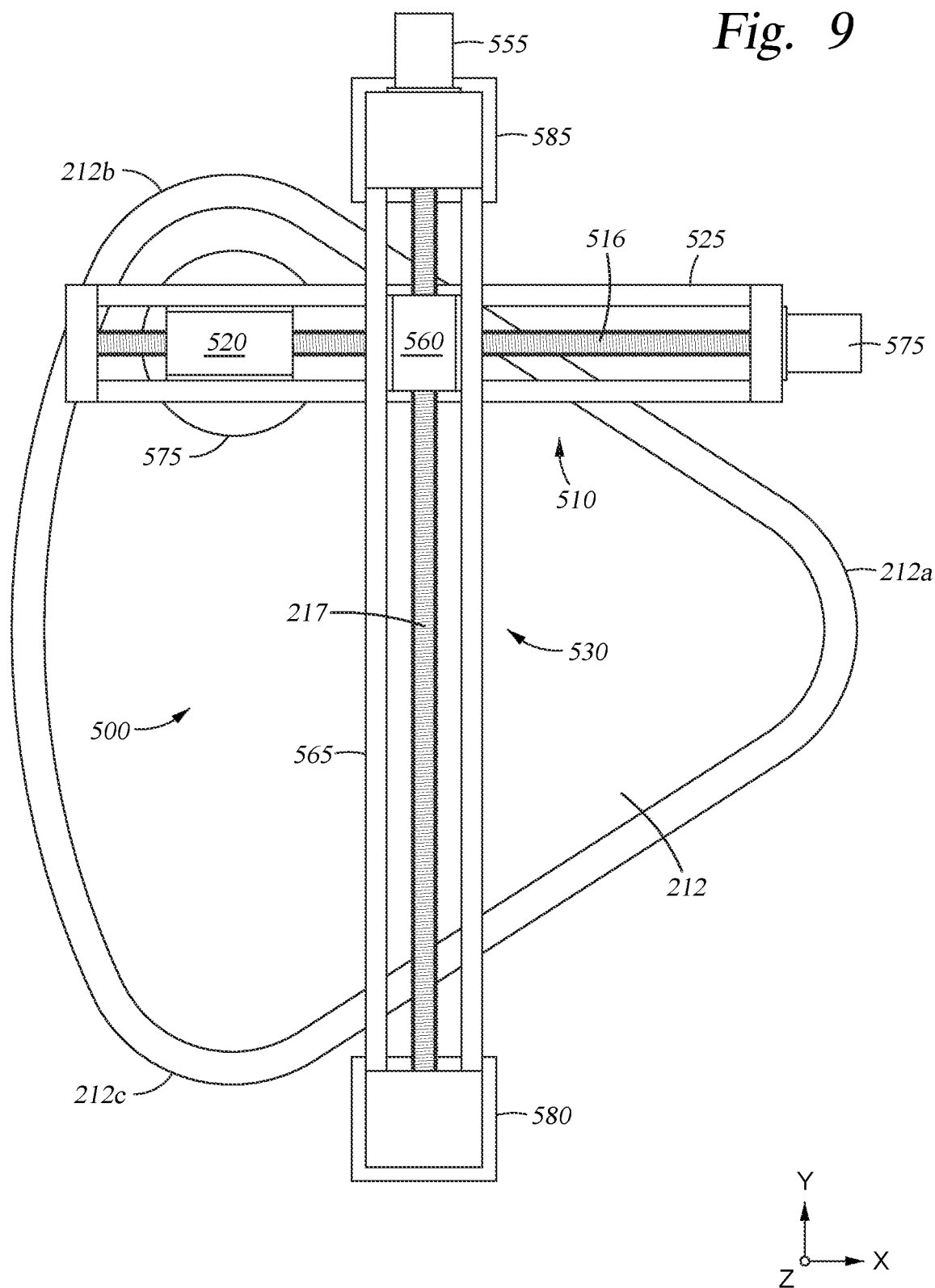

In FIG. 6, the magnet assembly 575 has been translated to one end of the first linear assembly 510 by operation of actuator 575, while the assembly itself is at a midpoint relative to the second assembly 550. This positioning of the components places the magnet assembly 575 over one of the three corners of the target 212, ensuring that target material from the corner region 212a is deposited onto the rotating substrate below (not shown). In FIG. 7, the magnet assembly 575 has moved along the first rail 525 of the first actuator assembly 510 to a location near the center thereof, while the first actuator assembly 510 itself, by operation of actuator 555 has translated away from its position over corner region 212a and moved towards one side of the target 212. FIG. 8 illustrates a position of the translation assembly 500 wherein the magnet assembly 575 has swept across the center portion of the target 212 and is positioned near an opposite side. In FIG. 9, the first and second linear actuator assemblies 510, 550 of the translation assembly 500 have placed the magnet assembly 575 over a second corner region 212b of the delta-shaped target 212. FIGS. 6-9 demonstrate that the magnetron translation assembly 500, with its first and second linear actuator assemblies 510, 550 can place a magnet assembly 575 over any portion of a target while maintaining a predetermined space between the lower surface of the magnet poles 590, 595 and the upper surface of the target. The lead screws and motors ensure a smooth transition of the magnet assembly and with it, a smooth and even removal of target material and a more even and predictable deposition of the target material onto a substrate.

FIG. 10 is a top view of a delta-shaped target 212 illustrating one path 600 of a magnet assembly 575 (not shown) over the target 212 as a result of the operation of the magnetron translation assembly 500. In the example shown, the magnet assembly 575 is initially placed at a starting point 600s over one corner region 212a of the target 212, a position corresponding to the location of the assembly in FIG. 6. Thereafter, through operation of the first and second linear actuator assemblies 510, 550, the magnet assembly is moved in a serpentine-like fashion with ever-lengthening arc-shaped portions 604a-f and curving end portions 602a-f to an end location 600e between the other two corners 212b, 212c of the target 212. The varying length of the curving end portions 602a-f corresponds to the widening shape of the target as the path 600 proceeds from starting point 600s to end point 600e. As illustrated, the serpentine path comprises a radial component and a circumferential component that forms a delta-shape as the serpentine path extends in an increasing radial direction.

FIG. 11 is a top view of the delta-shaped target 212 of FIG. 10 illustrating an additional path 620 of the magnet assembly 575 starting at a point 620s adjacent the end point 600e of path 600 and extending to a point 620e adjacent the starting point 600s of path 600. For clarity, previously formed path 600 is shown in dotted lines.

Considering FIGS. 10, 11 together, the second path 620 begins at location 620s and moves back towards corner region 212a in the same serpentine fashion with ever-decreasing arc-shaped portions 624a-f and curving end portions 622a-f. The arc-shaped portions of path 620 retrace the path of original linear portions 604a-f while curving end portions 622a-f address that part of the target untouched by the original path 600.

The completed path is formed by the magnet moving in its serpentine fashion from corner region 212a to an opposite, wider end of the target 212 and thereafter, moving back to the corner region 212a in a path slightly shifted from the original path. The result is a series of ever widening, arc-shaped formations formed between each liner portion. The even path 600 of the magnet assembly across the target 212 provides an equally even distribution of material as it is deposited on the substrate below the target. As mentioned, during a deposition process the substrate rotates on the pedestal 210 at a predetermined rate. At the same time, the magnetron translation assembly 500 moves the magnet assembly 575 over the delta-shaped target 212 as depicted in FIGS. 6-9 to produce a target erosion pattern like the one shown in FIGS. 10 and 11.

Figure 12:
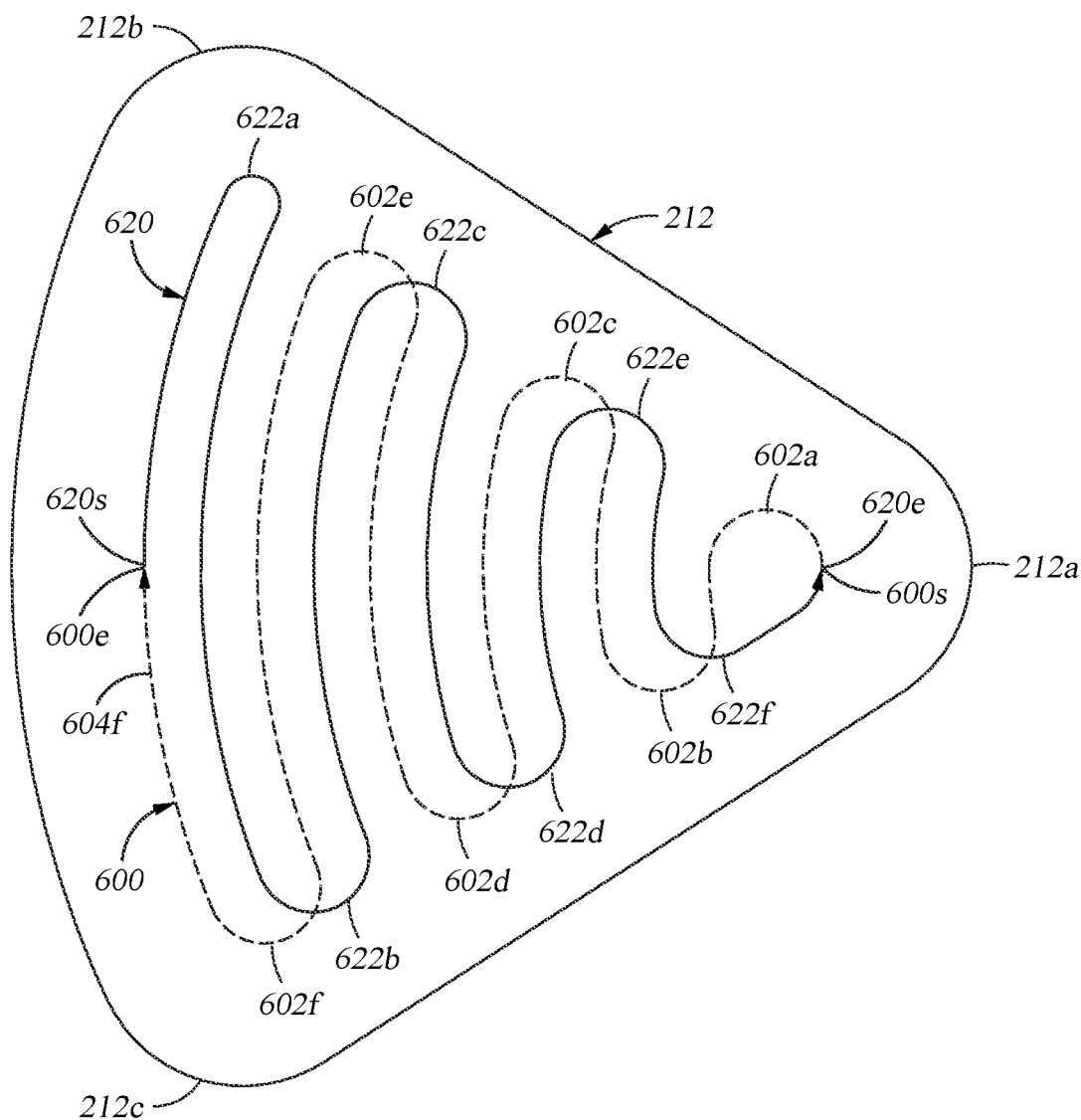
FIG. 12 is a top view of a delta-shaped target illustrating an alternative path of a magnet assembly over the target.
Figure 12:
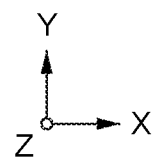

FIG. 12 is a top view of a delta-shaped target 212 illustrating alternative paths 600, 620 of a magnet assembly 575 over the target. For clarity, the initially formed path 600 with its arc-shaped portions and curving end portions 602a-e are shown in dotted lines. As in FIG. 11, path 600 starts at corner region 212a (600s) and ends at a midpoint 600e between corner regions 212b and 212c. The second path 620 in this embodiment, unlike the embodiment of FIGS. 10, 11 does not partially retrace the first path but rather, forms a completely new path from a starting point 620s to an end point 620e adjacent corner region 212a of the target 212. As illustrated by the Figure, with the exception of the paths intersecting at the curving end portions 622a-f, the paths, especially the arc-shaped portions, are independent. The result is a more effective removal of target material without creating grove-shaped formations in the surface of the target due to paths sharing the same route over the target.

A primary purpose of the magnetron translation assembly 500 is to facilitate the movement and positioning of a magnet assembly 575 over a target 212 while a substrate 216 therebelow is rotating on a pedestal 210. Due to the first 510 and second 550 linear actuator assemblies, the movements can be fluid and continuous to ensure a smooth rate of erosion of target material and a correspondingly smooth deposition of the material on various areas of the substrate 216. In addition to the linear movement of the magnet assembly 575, the speed at which it moves across the substrate is another variable that can be addressed by the translation assembly 500. For example, increasing or decreasing the speed of the first and/or the second actuators will speed up or slow the movement of the magnet assembly 575 during a deposition process. This feature is especially useful to compensate for the different rotational speeds of various parts of a rotating substrate.

Returning to FIG. 5A, the magnet assembly 575 is shown in a positon near the center line 291 of the substrate 216. As the substrate rotates in a counterclockwise direction 217, the substrate is moving past the target 212 at a first rotational or angular velocity. However, as the magnet assembly 575 is translated towards an opposing end of first linear actuator 510, the angular velocity of the substrate increases, an increase that can affect the uniformity of deposition due to the decreased time that the magnet assembly has to erode the target 212 over the moving substrate 216. In one embodiment, a system controller 250, as described below, can be programmed to increase or decrease the speed of translation of the magnet assembly across the substrate 216 depending on the distance of the magnet assembly from centerline 291. Alternatively, the system controller 250 could be programmed to synchronize the rotational speed of the pedestal motor 231 with the location of the magnet assembly 575 in order to increase or decrease the rotational speed of the substrate depending on the positon of magnet assembly 575. The operation described with respect to the single FIG. 5A is equally applicable to an arrangement with two magnetron translation assemblies 500, 700 as shown and discussed in relation to FIG. 5B.

A system controller 250, such as a programmable computer, is coupled to the PVD chamber 200 for controlling the PVD chamber 200 or components thereof. For example, the system controller 250 may control the operation of the PVD chamber 200 using direct control of the power source 206, the magnetron 208, the pedestal 210, cooling of the backing plate 218, the first actuator 220, the second actuator 222, the temperature control system 232, and/or the RF bias source 234, or using indirect control of other controllers associated therewith. In operation, the system controller 250 enables data acquisition and feedback from the respective components to coordinate processing in the PVD chamber 200.

The system controller 250 includes a programmable central processing unit (CPU) 252, which is operable with a memory 254 (e.g., non-volatile memory) and support circuits 256. The support circuits 256 (e.g., cache, clock circuits, input/output subsystems, power supplies, etc., and combinations thereof) are conventionally coupled to the CPU 252 and coupled to the various components of the PVD chamber 200.

In some embodiments, the CPU 252 is one of any form of general purpose computer processor used in an industrial setting, such as a programmable logic controller (PLC), for controlling various monitoring system component and sub-processors. The memory 254, coupled to the CPU 252, is non-transitory and is typically one or more of readily available memory such as random access memory (RAM), read only memory (ROM), floppy disk drive, hard disk, or any other form of digital storage, local or remote.

Herein, the memory 254 is in the form of a computer-readable storage media containing instructions (e.g., non-volatile memory), that when executed by the CPU 252, facilitates the operation of the PVD chamber 200. The instructions in the memory 254 are in the form of a program product such as a program that implements the methods of the present disclosure (e.g., middleware application, equipment software application, etc.). The program code may conform to any one of a number of different programming languages. In one example, the disclosure may be implemented as a program product stored on computer-readable storage media for use with a computer system. The program (s) of the program product define functions of the embodiments (including the methods described herein).

Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

In operation, the PVD chamber 200 is evacuated and back filled with argon gas. The power source 206 applies a negative bias voltage to the target 212 to generate an electric field inside the chamber body 202. The electric field acts to attract gas ions, which due to their collision with the exposed surface of the target 212, generates electrons that enable a high-density plasma to be generated and sustained near the underside of the target 212. The plasma is concentrated near the surface of target material 212M due to the magnetic field produced by the magnetron 208. The magnetic field forms a closed-loop annular path acting as an electron trap that reshapes the trajectories of the secondary electrons ejected from the target material 212M into a cycloidal path, greatly increasing the probability of ionization of the sputtering gas within the confinement zone. The plasma confined near the underside of the target 212 contains argon atoms, positively charged argon ions, free electrons, and neutral atoms (i.e., unionized atoms) sputtered from the target material 212M. The argon ions in the plasma strike the target surface and eject atoms of the target material, which are accelerated towards the substrate 216 to deposit a thin film on the substrate surface.

Inert gases, such as argon, are usually employed as the sputtering gas because they tend not to react with the target material or combine with any process gases and because they produce higher sputtering and deposition rates due to their relatively high molecular weight.

While the foregoing is directed to embodiments of the present disclosure, other and further embodiments of the disclosure may be devised without departing from the basic scope thereof, and the scope thereof is determined by the claims that follow.

What is claimed is:

1. A magnetron translation assembly, comprising:
   a first linear actuator assembly comprising:
      a first mount that is configured to be positioned along a first rail is aligned in a first direction; and
      a first actuator that is configured to position the first mount along the first rail;
   a second linear actuator assembly comprising:
      a second mount that is configured to be positioned along a second rail aligned in a second direction that is perpendicular to the first direction, wherein the first linear actuator assembly is coupled to a mounting surface of the second mount; and
      a second actuator that is configured to position the second mount and the first linear actuator assembly along the second rail;
   a magnet assembly comprising an inner pole having an inner pole piece and an outer pole having an outer pole piece, wherein the inner pole piece and the outer pole piece are oriented parallel to a plane and have opposing magnetic polarities; and
   a rotation actuator coupled between a mounting surface of the first mount of the first linear actuator assembly and the magnet assembly, wherein the rotation actuator is configured to rotate the magnet assembly about an axis, wherein the first and second actuators simultaneously translate the magnet assembly along the first and second directions, and wherein the first and second actuators are separately controlled from the rotation actuator.

2. The magnetron translation assembly of claim 1, wherein the magnet assembly is disposed over a surface of a target wherein the target has a triangular or delta-shape.

3. The magnetron translation assembly of claim 2, wherein when the surface of the target is parallel to the plane, and the plane is at a first angle to a central axis of a physical vapor deposition (PVD) chamber over which the magnetron translation assembly is disposed.

4. The magnetron translation assembly of claim 3, wherein the central axis is perpendicular to an upper surface of a pedestal disposed within the PVD chamber, and wherein the first and second actuators simultaneously translate the magnet assembly along the first and second directions in a plane perpendicular to the central axis.

5. The magnetron translation assembly of claim 4, wherein the second rail of the second linear actuator assembly is supported by a support disposed at each end of the second rail, wherein each of the supports are positioned at substantially the same radial distance from the central axis.

6. The magnetron translation assembly of claim 3, wherein the first angle is between about 2° to about 10°.

7. The magnetron translation assembly of claim 1, wherein the first actuator positions the first mount along the first rail by means of a first lead screw.

8. The magnetron translation assembly of claim 7, wherein the second actuator positions the second mount along the second rail by means of a second lead screw.

9. A physical vapor deposition (PVD) chamber, comprising:
   a magnetron translation assembly, comprising:
      a first linear actuator assembly comprising:
         a first mount that is configured to be positioned along a first rail aligned in a first direction; and
         a first actuator that is configured to position the first mount along the first rail;
      a second linear actuator assembly comprising:
         a second mount that is configured to be positioned along a second rail aligned in a second direction that is perpendicular to the first direction, and the first linear actuator assembly is coupled to a mounting surface of the second mount; and
         a second actuator that is configured to position the second mount and the first linear actuator assembly along the second rail;
      a magnet assembly comprising an inner pole having an inner pole piece and an outer pole having an outer pole piece, wherein the inner pole piece and the outer pole piece are oriented parallel to a plane and have opposing magnetic polarities; and
      a rotation actuator coupled between a mounting surface of the first mount of the first linear actuator assembly and the magnet assembly, wherein the rotation actuator is configured to rotate the magnet assembly about a first axis, wherein the first and second actuators simultaneously translate the magnet assembly along the first and second directions, and wherein the first and second actuators are separately controlled from the rotation actuator;

a pedestal disposed within a processing region of the PVD chamber, the pedestal having an upper surface that is configured to support a substrate thereon;

a first motor coupled to the pedestal, the first motor configured to rotate the pedestal about a second axis that is perpendicular to at least a portion of the upper surface of the pedestal; and a controller comprising memory for storing a program, the program comprising instructions when executed by a processor of the controller synchronize:

a movement of the first mount and rotation actuator along the first rail, by use of the first actuator, a movement of the second mount, the first linear actuator assembly, and rotation actuator along the second rail, by use of the second actuator, and a rotation of the magnet assembly about the first axis, wherein the first axis and second axis are non-parallel.

10. The physical vapor deposition (PVD) chamber of claim 9, wherein the instructions cause the magnet assembly to follow a serpentine path over the plane.

11. The physical vapor deposition (PVD) chamber of claim 10, wherein the serpentine path comprises a radial component that extends from the second axis and a circumferential component that forms a delta-shape as the serpentine path extends in an increasing radial direction from the second axis, wherein the radial and circumferential components result from synchronized rotational and linear movements of the magnet assembly.

12. The physical vapor deposition (PVD) chamber of claim 11, wherein the serpentine path begins at a first corner of the delta-shape and terminates between a second corner and a third corners, wherein the first corner is closest to the second axis.

13. The physical vapor deposition (PVD) chamber of claim 9, further comprises a second magnetron translation assembly that comprises:

a first linear actuator assembly comprising:
a first mount that is configured to be positioned along a first rail aligned in a first direction; and
a first actuator that is configured to position the first mount along the first rail;

a second linear actuator assembly comprising:
a second mount that is configured to be positioned along a second rail aligned in a second direction that is perpendicular to the first direction, wherein the first linear actuator assembly is coupled to a mounting surface of the second mount; and
a second actuator that is configured to position the second mount and the first linear actuator assembly along the second rail;

a magnet assembly comprising an inner pole having an inner pole piece and an outer pole having an outer pole piece, wherein the inner pole piece and the outer pole piece are oriented parallel to a plane and have opposing magnetic polarities; and a rotation actuator coupled between a mounting surface of the first mount of the first linear actuator assembly and the magnet assembly, wherein the rotation actuator is configured to rotate the magnet assembly about a first axis that is perpendicular to the plane.

14. The physical vapor deposition (PVD) chamber of claim 9, further comprising a rotary union coupled to the pedestal, the rotary union configured to provide fluid coupling to the pedestal during rotation of the pedestal about the first axis.

15. The physical vapor deposition (PVD) chamber of claim 14, wherein the upper surface of the pedestal is configured to receive a square or rectangular substrate having sides that have a length of about 500 mm or greater, wherein the pedestal and magnetron translation assembly are structurally configured to maintain deposition uniformity at substrate scales of 500 mm or greater.

16. A magnetron translation assembly, comprising:
a first linear actuator assembly comprising:
a first rail aligned in a first direction; and
a first actuator that is configured to position a first mount along the first rail;

a magnet assembly mounted on the first mount, the magnet assembly constructed and arranged to be rotated about an axis; and a second linear actuator assembly comprising:
a second mount that is configured to be positioned along a second rail aligned in a second direction, wherein the first linear actuator assembly is coupled to a mounting surface of the second mount, wherein the first and second actuators simultaneously translate the magnet assembly along the first and second directions, and wherein the first and second actuators are separately controlled from the rotation actuator.

17. The magnetron translation assembly of claim 16, wherein the first direction is perpendicular to the second direction.

18. The magnetron translation assembly of claim 1, further comprises a second magnetron translation assembly that comprises:

a first linear actuator assembly comprising:
a first mount that is configured to be positioned along a first rail aligned in a first direction; and
a first actuator that is configured to position the first mount along the first rail;

a second linear actuator assembly comprising:
a second mount that is configured to be positioned along a second rail aligned in a second direction that is perpendicular to the first direction, wherein the first linear actuator assembly is coupled to a mounting surface of the second mount; and
a second actuator that is configured to position the second mount and the first linear actuator assembly along the second rail;

a magnet assembly comprising an inner pole having an inner pole piece and an outer pole having an outer pole piece, wherein the inner pole piece and the outer pole piece are oriented parallel to a plane and have opposing magnetic polarities; and a rotation actuator coupled between a mounting surface of the first mount of the first linear actuator assembly and the magnet assembly, wherein the rotation actuator is configured to rotate the magnet assembly about a first axis that is perpendicular to the plane.

19. The magnetron translation assembly of claim 1, wherein the rotation actuator is configured to rotate the magnet assembly about the axis perpendicular to the plane independently of movement along the first and second directions.

20. The magnetron translation assembly of claim 16, wherein the rotation actuator is configured to rotate the magnet assembly about the axis perpendicular to the plane independently of movement along the first and second directions, and wherein the magnet assembly is disposed over a surface of a target having a triangular or delta-shape.

* * * * *